(12) United States Patent
Nakamura

(10) Patent No.: US 11,387,133 B2
(45) Date of Patent: Jul. 12, 2022

(54) WAFER PROCESSING METHOD

(71) Applicant: DISCO CORPORATION, Tokyo (JP)

(72) Inventor: Masaru Nakamura, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 2 days.

(21) Appl. No.: 17/211,186

(22) Filed: Mar. 24, 2021

(65) Prior Publication Data

US 2021/0327744 A1    Oct. 21, 2021

(30) Foreign Application Priority Data

Apr. 21, 2020  (JP) .............................. JP2020-075204

(51) Int. Cl.
*H01L 21/78* (2006.01)
*H01L 21/683* (2006.01)
*H01L 21/304* (2006.01)

(52) U.S. Cl.
CPC ........ *H01L 21/6836* (2013.01); *H01L 21/304* (2013.01); *H01L 21/78* (2013.01)

(58) Field of Classification Search
CPC ... H01L 21/6836; H01L 21/304; H01L 21/78; H01L 2221/68327; H01L 21/02016; H01L 21/3043; H01L 2221/6834; B23K 26/53

See application file for complete search history.

(56) References Cited

U.S. PATENT DOCUMENTS

| | | | | |
|---|---|---|---|---|
| 2007/0020887 A1* | 1/2007 | Sekiya | ................... | H01L 21/304 438/459 |
| 2014/0106545 A1* | 4/2014 | Okada | .................... | B23K 26/10 438/463 |
| 2015/0251902 A1* | 9/2015 | Bernales | ............. | B81C 1/00904 438/50 |
| 2018/0102288 A1* | 4/2018 | Bae | ........................ | H01L 21/304 |

FOREIGN PATENT DOCUMENTS

JP          2007019461 A       1/2007

* cited by examiner

*Primary Examiner* — Thanh T Nguyen
(74) *Attorney, Agent, or Firm* — Greer Burns & Crain Ltd.

(57) ABSTRACT

A wafer processing method includes a modified layer forming step, a protective member disposing step, a reinforcing portion forming step, and an undersurface processing step. The modified layer forming step forms, in a ring shape, a modified layer not reaching a finished thickness of a wafer by irradiating the wafer with a laser beam such that a condensing point of the laser beam is positioned in an inner part of the wafer, the inner part corresponding to a peripheral surplus region. The reinforcing portion forming step makes a cleavage plane reach the top surface from the modified layer formed in a ring shape, removes the modified layer, thins a region corresponding to a device region of the wafer to the finished thickness, and forms a ring-shaped reinforcing portion in a region corresponding to the peripheral surplus region of the wafer by grinding the undersurface of the wafer.

2 Claims, 4 Drawing Sheets

WAFER PROCESSING METHOD

BACKGROUND OF THE INVENTION

Field of the Invention

The present invention relates to a method of processing a wafer where a device region and a peripheral surplus region surrounding the device region are formed on a top surface of the wafer.

DESCRIPTION OF THE RELATED ART

A wafer where a device region in which a plurality of devices such as integrated circuits (ICs) or large scale integrations (LSIs) are demarcated by a plurality of planned dividing lines and a peripheral surplus region surrounding the device region are formed on the top surface of the wafer is reduced to a predetermined thickness by grinding the undersurface of the wafer by a grinding apparatus, and is thereafter divided into individual device chips by a dicing apparatus or a laser processing apparatus. The device chips are used in electric apparatuses such as mobile phones or personal computers.

In addition, the present applicant has proposed a technology of forming an annular reinforcing portion on the undersurface corresponding to the peripheral surplus region by grinding the undersurface corresponding to the device region of the wafer, thereafter removing the annular reinforcing portion in the peripheral surplus region by subjecting the wafer to processing, and dividing the wafer into individual device chips (see Japanese Patent Laid-Open No. 2007-19461).

SUMMARY OF THE INVENTION

According to the technology of Japanese Patent Laid-Open No. 2007-19461 described above, because the annular reinforcing portion is formed on the undersurface corresponding to the peripheral surplus region, the wafer thinned by grinding the undersurface side corresponding to the device region is supported stably, and is handled excellently at a time of processing. However, in order to divide the wafer having the reinforcing portion formed thereon into individual device chips, the reinforcing portion needs to be removed by a cutting blade. When the reinforcing portion is removed by the cutting blade, there is a possibility of damaging devices located in the vicinity of the reinforcing portion. Thus, the outer edge of the device region needs to be set so as to be separated sufficiently inward from the region in which the reinforcing portion is formed. Therefore, there is a problem in that a region in which the device region is set is limited, which results in poor productivity.

In addition, in a case where the annular reinforcing portion formed at the outer circumference of the wafer is removed by laser processing, a problem occurs in that a modified layer or debris remains at the outer circumference of the wafer, and the wafer is damaged from a position at which the modified layer or the debris remains.

Accordingly, it is an object of the present invention to provide a wafer processing method that makes it possible to set a device region in proximity to a region in which a ring-shaped reinforcing portion is formed without leaving a modified layer or debris at the outer circumference of a wafer.

In accordance with an aspect of the present invention, there is provided a wafer processing method of processing a wafer having a device region and a peripheral surplus region formed on a top surface of the wafer, the device region having a plurality of devices demarcated by a plurality of planned dividing lines, the peripheral surplus region surrounding the device region, the method including a modified layer forming step, a protective member disposing step, a reinforcing portion forming step, and an undersurface processing step. The modified layer forming step forms, in a ring shape, a modified layer not reaching a finished thickness of the wafer by irradiating the wafer with a laser beam of a wavelength transmissible through the wafer from an undersurface of the wafer such that a condensing point of the laser beam is positioned in an inner part of the wafer, the inner part corresponding to the peripheral surplus region. The protective member disposing step disposes a protective member on the top surface of the wafer before or after the modified layer forming step. The reinforcing portion forming step makes a cleavage plane reach the top surface from the modified layer formed in a ring shape, removes the modified layer, thins a region corresponding to a device region of the wafer to the finished thickness, and forms a ring-shaped reinforcing portion in a region corresponding to the peripheral surplus region of the wafer by holding the protective member side by a chuck table and grinding the undersurface of the wafer. The undersurface processing step performs predetermined processing on the undersurface of the wafer.

Preferably, the wafer processing method further includes a transfer step of and a dividing step. The transfer step, after the undersurface processing step, removes the ring-shaped reinforcing portion along the cleavage plane formed in the reinforcing portion forming step, removes the protective member from the top surface of the wafer, affixes the undersurface of the wafer to a dicing tape, and supports a periphery of the dicing tape by a frame having an opening portion configured to house the wafer. The dividing step divides the wafer into each individual device chip by subjecting the planned dividing lines of the wafer to processing.

In the wafer processing method according to one aspect of the present invention, the wafer is divided along the cleavage plane, and the modified layer is removed. Thus, the modified layer and debris do not remain on the wafer. Hence, the problem of damaging the wafer from a position at which the modified layer or the debris remains is solved. In addition, because the wafer is divided along the cleavage plane, the device region can be set as far as an edge of the region in which the ring-shaped reinforcing portion is formed. Hence, productivity is improved.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

An embodiment of the present invention will hereinafter be described in detail with reference to the accompanying drawings.

Figure 1:
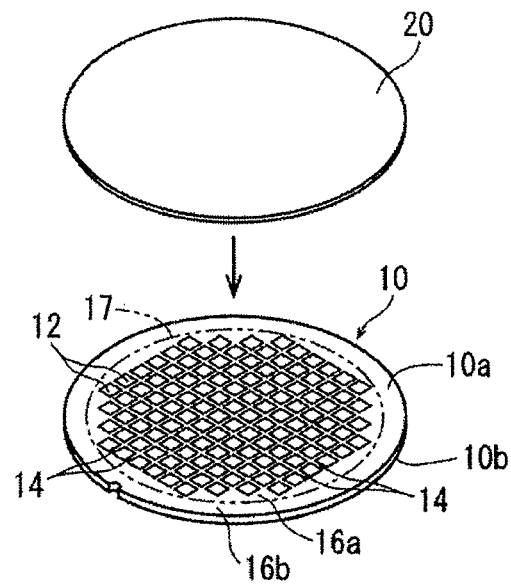
FIG. 1 is a perspective view illustrating a manner in which a protective member disposing step according to an embodiment of the present invention is performed.

FIG. 1 illustrates a wafer 10 to be processed by a wafer processing method according to the present embodiment. The wafer 10 is a disk-shaped member formed with a thickness of 700 µm. The wafer 10 has a top surface 10a and an undersurface 10b. The wafer 10 is formed of silicon, for example. Formed on the top surface 10a of the wafer 10 are a device region 16a in which a plurality of devices 12 are demarcated by a plurality of planned dividing lines 14 and a peripheral surplus region 16b that surrounds the device region 16a. Incidentally, while a boundary 17 that divides the device region 16a and the peripheral surplus region 16b from each other is indicated by chain double-dashed lines in FIG. 1, the boundary 17 is an imaginary line illustrated for the convenience of description and is not formed on the top surface 10a of an actual wafer 10.

In performing the wafer processing method according to the present embodiment, a protective member 20 as illustrated in FIG. 1 is prepared. The protective member 20 is, for example, a circular adhesive tape having a same diameter as the wafer 10. When such a protective member 20 is prepared, the protective member 20 is affixed to the top surface 10a of the wafer 10 (protective member disposing step).

Figure 2:
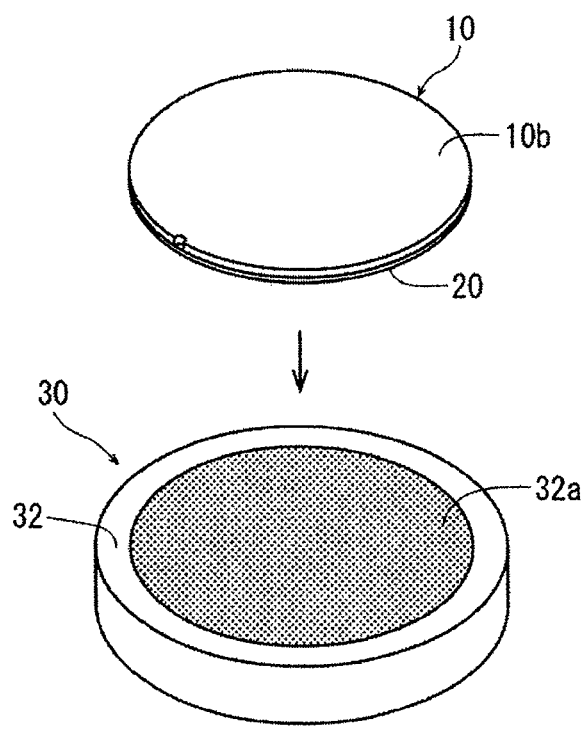
FIG. 2 is a perspective view illustrating a manner in which a wafer is held on a chuck table of a laser processing apparatus.

Next, as illustrated in FIG. 2, the wafer 10 is transported to a laser processing apparatus 30 (only a part thereof is illustrated), and the wafer 10 is mounted onto a holding surface 32a of a chuck table 32 while the undersurface 10b side of the wafer 10 is oriented upward, the protective member 20 side of the wafer 10 is oriented downward, and the center of the wafer 10 is positioned at the center of the chuck table 32. The chuck table 32 has an unillustrated rotation driving mechanism so that the chuck table 32 can be rotated. The holding surface 32a is a flat surface. The holding surface 32a is formed of a material having air permeability. The holding surface 32a is connected to an unillustrated suction source via the inside of the chuck table 32. The wafer 10 mounted on the holding surface 32a is held under suction by actuating the suction source.

Figure 3A:
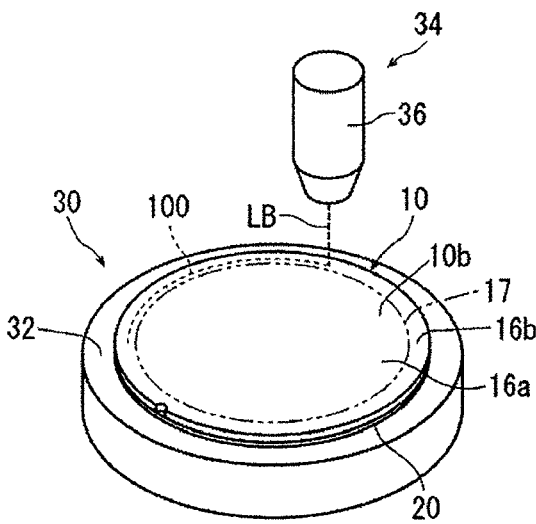
FIG. 3A is a perspective view illustrating a mode of a modified layer forming step.

Next, an alignment step is performed with the chuck table 32 positioned immediately below an unillustrated alignment unit, the wafer 10 is detected and the laser processing position of the wafer 10 is detected, and positional information on the laser processing position is stored in an unillustrated control unit of the laser processing apparatus 30. Next, on the basis of the positional information, as illustrated in FIG. 3A, the wafer 10 is positioned directly below a condenser 36 of a laser beam irradiating unit 34. The laser beam irradiating unit 34 is means for applying a laser beam LB. A position irradiated with the laser beam LB is a position corresponding to the peripheral surplus region 16b and is a position on the outside of the boundary 17 that divides the device region 16a and the peripheral surplus region 16b from each other.

Figure 3B:
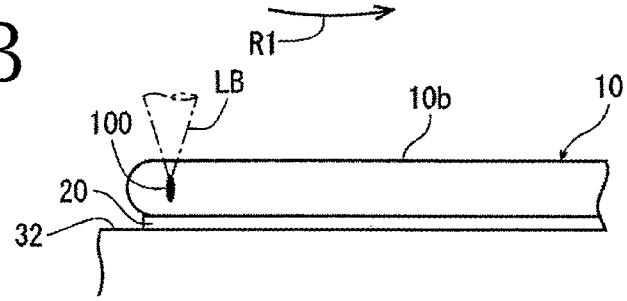
FIG. 3B is a partial enlarged sectional view corresponding to a part of FIG. 3A.

A depth position of a condensing point of the laser beam LB is in an internal part of the position corresponding to the above-described peripheral surplus region 16b and is such a position as to form, in a ring shape, a modified layer 100 not reaching a finished thickness of the wafer 10 as viewed from the undersurface 10b side (see FIG. 3B). Incidentally, the finished thickness of the wafer 10 in the present embodiment is set at approximately 30 µm. The modified layer 100 is therefore formed equal to or more than 30 µm above the top surface 10a on which the devices 12 are formed. Thus, the position corresponding to the peripheral surplus region 16b of the wafer 10 is positioned directly below the condenser 36 of the laser beam irradiating unit 34, the laser beam LB is applied by actuating the laser beam irradiating unit 34, and the chuck table 32 is rotated in a direction indicated by an arrow R1. The modified layer 100 illustrated in FIG. 3B is thereby formed throughout the entire circumference of the internal part of the position corresponding to the peripheral surplus region 16b. As a result of the above, a modified layer forming step is completed.

Incidentally, conditions for the laser processing performed in the above-described modified layer forming step are, for example, set as illustrated in the following.

Figure 4A:
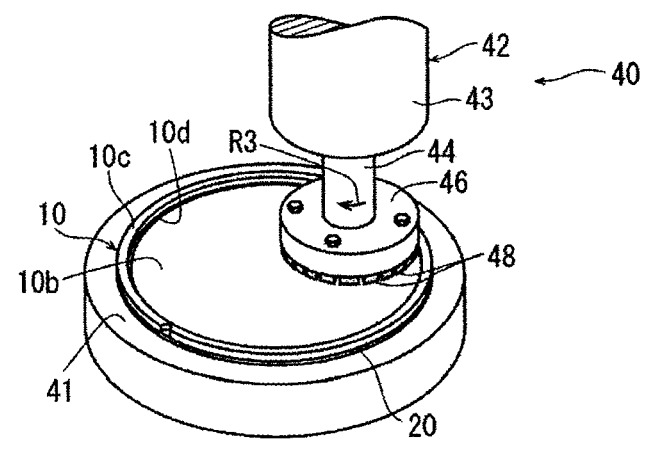
FIG. 4A is a perspective view illustrating a mode of a reinforcing portion forming step.

Wavelength: 1342 nm
Repetition frequency: 60 kHz
Average power: 1.6 W
Chuck table rotational speed: 0.5 revolutions per second After the modified layer forming step is performed as described above, the wafer 10 is transported to a grinding apparatus 40 illustrated in FIG. 4A (only a part of the grinding apparatus 40 is illustrated), and a reinforcing portion forming step is performed which grinds the undersurface 10b of the wafer 10, thereby makes a cleavage plane, which is formed with the modified layer 100 formed in a ring shape as a starting point, reach the top surface 10a of the wafer 10, removes the modified layer 100, thins a region corresponding to the device region 16a in the wafer 10 to the finished thickness, and forms a ring-shaped reinforcing portion in a region corresponding to the peripheral surplus region 16b. It is to be noted that, while the protective member disposing step is performed before the modified layer forming step is performed in the embodiment described above, the present invention is not limited to this, but the protective member disposing step may be performed in a period after the modified layer forming step is performed and before the reinforcing portion forming step to be described in the following is performed. The reinforcing portion forming step will be more concretely described in the following with reference to FIG. 4A and FIG. 4B.

As illustrated in FIG. 4A, the grinding apparatus 40 includes a chuck table 41 that holds the wafer 10 under suction and a grinding unit 42 that grinds the wafer 10 held on the chuck table 41. The chuck table 41 includes a rotation driving mechanism (not illustrated) that rotates the chuck table 41 in a direction indicated by an arrow R2 at a predetermined rotational speed. In addition, the chuck table 41 has a holding surface (not illustrated) formed by a material having air permeability. The holding surface is connected to an unillustrated suction source.

The grinding unit 42 includes a spindle housing 43, a spindle 44 rotatably retained in the spindle housing 43, a spindle motor (not illustrated) that rotates the spindle 44 at a predetermined rotational speed, a disk-shaped grinding wheel 46 fixed to a lower end of the spindle 44, and a plurality of grinding stones 48 arranged annularly at equal intervals on an outer circumferential edge portion of the undersurface of the grinding wheel 46. When the spindle motor is actuated, the spindle 44 is rotated in a direction indicated by an arrow R3 so that the grinding wheel 46 can be rotated. Incidentally, a diameter of the grinding wheel 46 is set so as to substantially coincide with a radius of the wafer 10.

In performing the reinforcing portion forming step, the wafer 10 is mounted onto the chuck table 41 such that the protective member 20 side of the wafer 10 is oriented downward and such that the center of the wafer 10 is positioned at the center of the chuck table 41. The wafer 10 is then held under suction on the chuck table 41. Next, the position of the wafer 10 with respect to the grinding stones 48 is set such that the grinding stones 48 arranged annularly pass the center of the wafer 10 and such that outer end portions of the grinding stones 48 are located on the inside of the outer circumference of the wafer 10 in a radial direction. At this time, the positions of the outer end portions of the grinding stones 48 are located slightly outward of the position in which the modified layer 100 is formed, the position corresponding to the peripheral surplus region 16b.

Next, the chuck table 41 is rotated in the direction indicated by the arrow R2 at a predetermined rotational speed (for example, 300 rpm), and the spindle 44 of the grinding unit 42 is rotated in the direction indicated by the arrow R3 at a predetermined rotational speed (for example, 6000 rpm). Next, the grinding wheel 46 is lowered by actuating a raising and lowering mechanism of the grinding unit 42, the raising and lowering mechanism being not illustrated, so that the grinding stones 48 are brought into contact with the undersurface 10b of the wafer 10. The grinding wheel 46 is thereafter grinding-fed at a predetermined grinding-feed speed (for example, 1 µm/second).

Figure 4B:
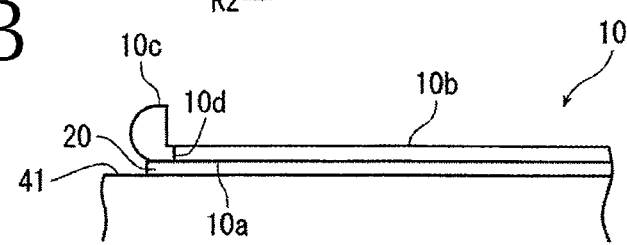
FIG. 4B is a partial enlarged sectional view corresponding to a part of FIG. 4A.

As described above, the outer end portions of the grinding stones 48 are located on the outside of the position in which the modified layer 100 is formed. When the above-described grinding processing is made to progress, the modified layer 100 is ground, and a cleavage plane 10d extends to the top surface 10a side on which the devices 12 are formed with the position in which the modified layer 100 is formed as a starting point. When the undersurface 10b of the wafer 10 is thus ground to the finished thickness (30 µm), as illustrated in FIG. 4B, the modified layer 100 is completely removed, and the cleavage plane 10d extending from the position in which the modified layer 100 is formed reaches the top surface 10a side. The continuous cleavage plane 10d forms an annular dividing line. Then, a part including the region corresponding to the device region 16a is thinned from the undersurface 10b, and a reinforcing portion 10c constituting an annular projecting shape is formed in the region corresponding to the peripheral surplus region 16b. Incidentally, a width of the reinforcing portion 10c is set to be a width (for example, approximately 2 to 3 mm) such that the wafer 10 thinned to the finished thickness can be handled stably. As a result of the above, the reinforcing portion forming step is completed.

Next, the wafer 10 having the reinforcing portion 10c formed thereon is transported to an undersurface processing apparatus (not illustrated), and an undersurface processing step is performed which performs predetermined processing on the undersurface 10b of the thinned region of the wafer 10. The undersurface processing apparatus is, for example, an apparatus that coats the undersurface 10b of the region of the wafer 10, which region is thinned by being subjected to processing in the reinforcing portion forming step, with a metallic film 11 (see FIG. 5) for forming electrodes or the like. Even though the region corresponding to the device region 16a is thinned to 30 µm, the wafer 10 can be handled stably without being bent when the wafer 10 is transported to the undersurface processing apparatus because the ring-shaped reinforcing portion 10c is formed. It therefore becomes easy to apply the undersurface processing step to the wafer 10. Then, as a result of performing the wafer processing method including the modified layer forming step, the protective member disposing step, the reinforcing portion forming step, and the undersurface processing step as described above, the device region 16a and the peripheral surplus region 16b of the wafer 10 are divided in a ring manner by the cleavage plane 10d, and the device region 16a can be set as far as an edge of a region in which the ring-shaped cleavage plane 10d is formed. That is, more devices 12 can be set in the device region 16a, so that productivity is improved.

After the above-described wafer processing method is performed, that is, after the undersurface processing step is performed, a dividing step may be performed as required which removes the ring-shaped reinforcing portion 10c along the cleavage plane 10d formed in the reinforcing portion forming step and divides the wafer 10 into individual device chips. In the following, the dividing step will be described with reference to FIGS. 6 to 8 in addition to FIG. 5.

Figure 5:
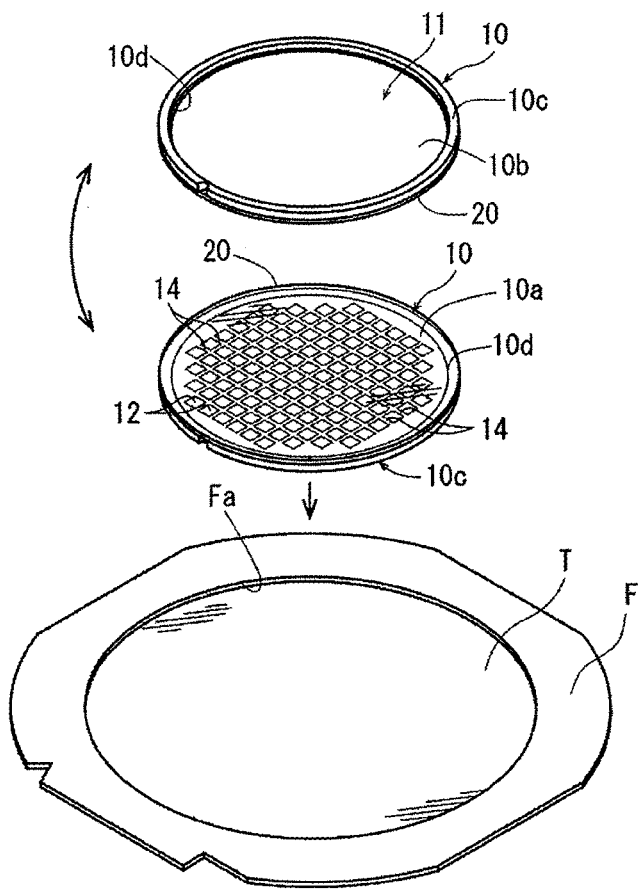
FIG. 5 is a perspective view illustrating a manner in which the wafer is made to be supported by a frame via a dicing tape.

In performing the dividing step, first, as illustrated in FIG. 5, an annular frame F having an opening portion Fa of such a size as to be able to house the wafer 10 and a dicing tape T are prepared. The dicing tape T has a circular shape. A diameter of the dicing tape T is larger than that of the opening portion Fa. The outer circumferential edge of the dicing tape T is affixed to the undersurface of the frame F. As illustrated in FIG. 5, the undersurface 10b side on which the metallic film 11 is formed is oriented downward by inverting the wafer 10, and the wafer 10 is positioned at the center of the opening portion Fa of the frame F and affixed to the dicing tape T. The wafer 10 is thus supported by the frame F via the dicing tape T.

Figure 6:
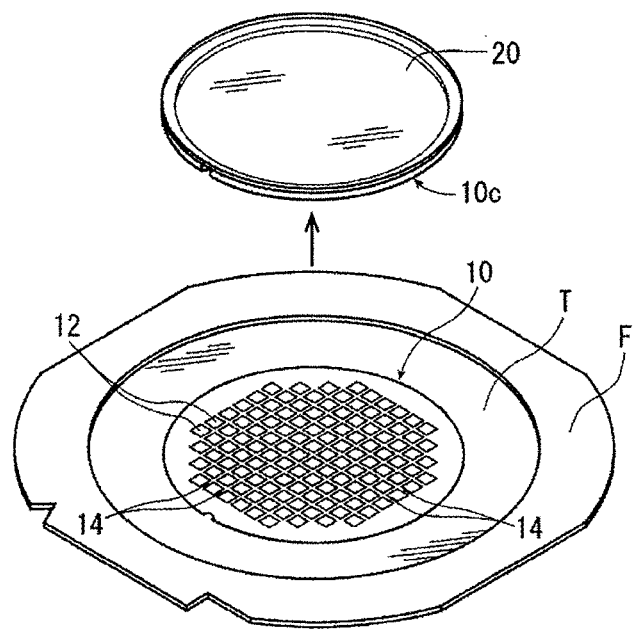
FIG. 6 is a perspective view illustrating a manner in which a reinforcing portion and a protective member are removed in a transfer step.

As is understood from FIG. 5, the cleavage plane 10d reaches the top surface 10a side of the wafer 10, and the device region 16a whose undersurface 10b side is thinned and the region in which the reinforcing portion 10c is formed are already divided from each other. Utilizing this, as illustrated in FIG. 6, while the undersurface 10b of the wafer 10 is affixed to the center of the dicing tape T by pressing the device region 16a from above, the protective member 20 and the ring-shaped reinforcing portion 10c are removed from the wafer 10 along the cleavage plane 10d. As a result of the above, the wafer 10 from which the reinforcing portion 10c is removed is affixed to the dicing tape T, and the outer circumference of the dicing tape T is supported by the frame F, so that the wafer 10 is transferred from the protective member 20 to the dicing tape T (transfer step).

Figure 7:
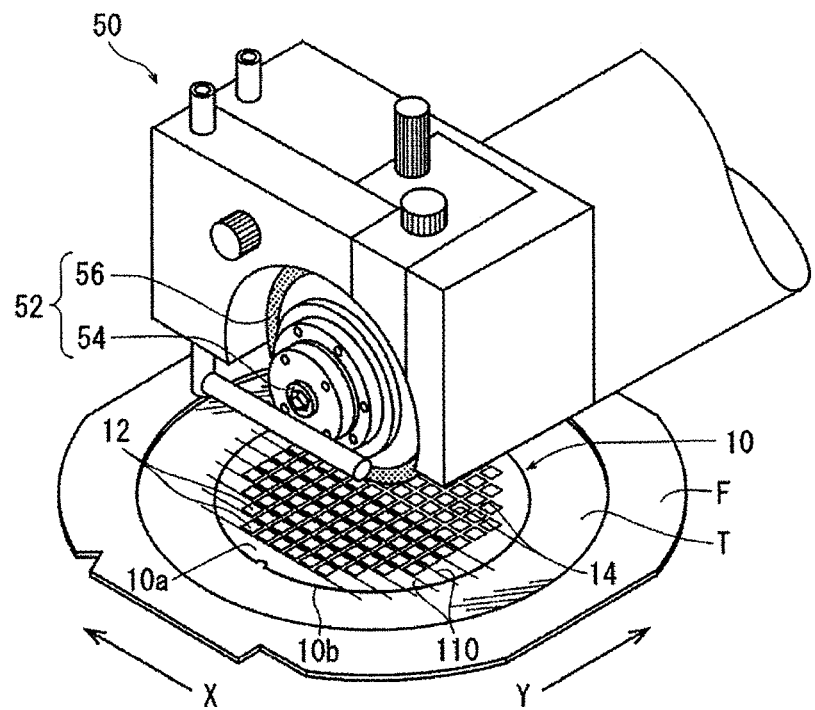
FIG. 7 is a perspective view illustrating a mode of a dividing step.

Next, in order to apply the dividing step to the wafer 10 transferred to the dicing tape T and retained by the frame F, the wafer 10 retained by the frame F is transported to a cutting apparatus 50 illustrated in FIG. 7. The cutting apparatus 50 includes a chuck table (not illustrated) that holds the wafer 10 under suction and a cutting unit 52 that cuts the wafer 10 held under suction on the chuck table. The chuck table is configured to be rotatable and includes a moving mechanism (not illustrated) that processing-feeds the chuck table in a direction indicated by an arrow X in the figure. In addition, the cutting unit 52 includes a spindle 54 disposed and retained in a Y-axis direction indicated by an arrow Y in the figure, an annular cutting blade 56 retained at a distal end of the spindle 54, and a Y-axis moving mechanism (not illustrated) that indexing-feeds the cutting blade 56 in the Y-axis direction. The spindle 54 is rotationally driven by a spindle motor, not illustrated.

In performing the dividing step, first, the wafer 10 is mounted and held under suction on the chuck table of the cutting apparatus 50 with the top surface 10*a* of the wafer 10 oriented upward, and a predetermined planned dividing line 14 of the wafer 10 is aligned in an X-axis direction and aligned with the cutting blade 56. Next, a dividing groove 110 is formed by positioning the cutting blade 56 rotated at a high speed at the planned dividing line 14 aligned in the X-axis direction and making the cutting blade 56 cut in from the top surface 10*a* side, and processing-feeding the chuck table in the X-axis direction. Further, the cutting blade 56 of the cutting unit 52 is indexing-fed to a position above a planned dividing line 14 in which no dividing groove 110 is formed, the planned dividing line 14 being adjacent in the Y-axis direction to the planned dividing line 14 in which the dividing groove 110 is formed, and the cutting processing of forming a dividing groove 110 in a similar manner to the above is performed. Dividing grooves 110 are formed along all of planned dividing lines 14 along the X-axis direction by repeating the above. Next, the chuck table is rotated by 90 degrees, a direction orthogonal to the direction in which the dividing grooves 110 are previously formed is aligned in the X-axis direction, and the above-described cutting processing is performed on all of planned dividing lines 14 newly aligned in the X-axis direction. Dividing grooves 110 are thereby formed along all of the planned dividing lines 14 formed on the wafer 10. The dividing step is thus performed to thereby divide the wafer 10 into device chips of the respective devices 12 along the planned dividing lines 14 (dividing step).

Figure 8:
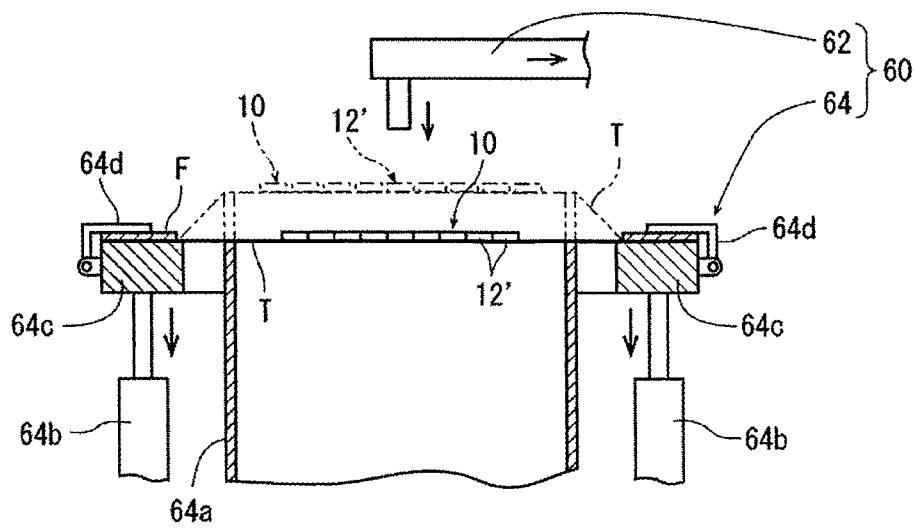
FIG. 8 is a sectional view illustrating a mode of a pickup step.

After the dividing step is performed as described above, a pickup step may be performed as required which picks up device chips 12' from the dicing tape T, as illustrated in FIG. 8. The pickup step can be performed by using a pickup apparatus 60 illustrated in FIG. 8, for example. The pickup apparatus 60 includes a pickup collet 62 that sucks and transports the device chips 12' and an expanding unit 64 that expands intervals between the device chips 12' adjacent to each other by expanding the dicing tape T.

As illustrated in FIG. 8, the expanding unit 64 includes a cylindrical expanding drum 64*a*, a plurality of air cylinders 64*b* adjacent to the expanding drum 64*a* and extending upward at intervals in a circumferential direction, annular holding members 64*c* coupled to respective upper ends of the air cylinders 64*b*, and a plurality of clamps 64*d* arranged on outer circumferential edge portions of the holding members 64*c* at intervals in the circumferential direction. An inside diameter of the expanding drum 64*a* is larger than the diameter of the wafer 10. An outside diameter of the expanding drum 64*a* is smaller than an inside diameter Fa of the frame F. In addition, the holding members 64*c* correspond to the frame F, and the frame F is placed on flat upper surfaces of the holding members 64*c*.

As illustrated in FIG. 8, the plurality of air cylinders 64*b* raise and lower the holding members 64*c* relative to the expanding drum 64*a* between a reference position (indicated by a solid line) at which the upper surfaces of the holding members 64*c* are at substantially the same height as an upper end of the expanding drum 64*a* and an expansion position (indicated by a chain double-dashed line) at which the upper surfaces of the holding members 64*c* are located below the upper end of the expanding drum 64*a*.

The pickup collet 62 illustrated in FIG. 8 is configured to be movable in a horizontal direction and a vertical direction. In addition, a suction source (not illustrated) is connected to the pickup collet 62 such that a device chip 12' is sucked by a lower surface of a distal end of the pickup collet 62.

Continuing the description with reference to FIG. 8, in the pickup step, first, the wafer 10 divided into the individual device chips 12' is oriented upward, and the frame F is placed onto the upper surfaces of the holding members 64*c* positioned at the reference position. Next, the frame F is fixed by the plurality of clamps 64*d*. Next, when the holding members 64*c* are lowered to the expansion position, a radial tension acts on the dicing tape T. Then, as indicated by a chain double-dashed line in FIG. 8, the intervals between the device chips 12' affixed to the dicing tape T are expanded.

Next, the pickup collet 62 is lowered after being positioned above a device chip 12' to be picked up, and the upper surface of the device chip 12' is sucked by the lower surface of the distal end of the pickup collet 62. Next, the pickup collet 62 is raised, so that the device chip 12' is peeled and picked up from the dicing tape T. Next, the picked-up device chip 12' is transported to an unillustrated tray or the like or transported to a predetermined transportation position in a next step. Then, the pickup step is completed after such pickup work is performed for all of the device chips 12' in order.

According to the foregoing embodiment, the wafer 10 is divided along the cleavage plane 10*d*, and the modified layer is removed. Thus, the modified layer and debris do not remain on the wafer 10. Hence, the problem of damaging the wafer 10 from a position at which the modified layer or debris remains is solved. In addition, because the wafer 10 is divided along the cleavage plane 10*d*, the device region 16*a* can be set as far as an edge of the region in which the ring-shaped reinforcing portion 10*c* is formed. Hence, productivity is improved.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method of processing a wafer having a device region and a peripheral surplus region formed on a top surface of the wafer, the device region having a plurality of devices demarcated by a plurality of planned dividing lines, the peripheral surplus region surrounding the device region, the method comprising:

a modified layer forming step of forming, in a ring shape, a modified layer not reaching a finished thickness of the wafer by irradiating the wafer with a laser beam of a wavelength transmissible through the wafer from an undersurface of the wafer such that a condensing point of the laser beam is positioned in an inner part of the wafer, the inner part corresponding to the peripheral surplus region;

a protective member disposing step of disposing a protective member on the top surface of the wafer before or after the modified layer forming step;

a reinforcing portion forming step of making a cleavage plane reach the top surface from the modified layer formed in a ring shape, removing the modified layer, thinning a region corresponding to the device region of the wafer to the finished thickness, and forming a ring-shaped reinforcing portion in a region corresponding to the peripheral surplus region of the wafer by holding the protective member side by a chuck table and grinding the undersurface of the wafer; and an undersurface processing step of performing predetermined processing on the undersurface of the wafer.

2. The wafer processing method according to claim 1, further comprising:

a transfer step of, after the undersurface processing step, removing the ring-shaped reinforcing portion along the cleavage plane formed in the reinforcing portion forming step, removing the protective member from the top surface of the wafer, affixing the undersurface of the wafer to a dicing tape, and supporting a periphery of the dicing tape by a frame having an opening portion configured to house the wafer; and a dividing step of dividing the wafer into each individual device chip by subjecting the planned dividing lines of the wafer to processing.

* * * * *